(12) United States Patent
Okano

(10) Patent No.: US 9,402,325 B2
(45) Date of Patent: Jul. 26, 2016

(54) PORTABLE ELECTRONIC DEVICE AND METHOD OF PROTECTING PORTABLE ELECTRONIC DEVICE

(75) Inventor: Masato Okano, Kanagawa (JP)

(73) Assignee: NEC CORPORATION, Tokyo (JP)

( * ) Notice: Subject to any disclaimer, the term of this patent is extended or adjusted under 35 U.S.C. 154(b) by 187 days.

(21) Appl. No.: 13/988,374

(22) PCT Filed: Nov. 8, 2011

(86) PCT No.: PCT/JP2011/006241
§ 371 (c)(1),
(2), (4) Date: May 20, 2013

(87) PCT Pub. No.: WO2012/111056
PCT Pub. Date: Aug. 23, 2012

(65) Prior Publication Data
US 2013/0242486 A1 Sep. 19, 2013

(30) Foreign Application Priority Data
Feb. 15, 2011 (JP) .................... 2011-029802

(51) Int. Cl.
*H05K 5/02* (2006.01)
*H05K 13/00* (2006.01)
*H04M 1/18* (2006.01)

(52) U.S. Cl.
CPC ............. *H05K 5/0217* (2013.01); *H04M 1/185* (2013.01); *H05K 13/0015* (2013.01); *Y10T 29/49002* (2015.01)

(58) Field of Classification Search
USPC .............................. 361/697, 697.3
See application file for complete search history.

(56) References Cited

U.S. PATENT DOCUMENTS

| 7,542,565 | B2 | 6/2009 | Tsutaichi et al. |
| 7,738,929 | B2 | 6/2010 | Jeong |
| 2006/0177048 | A1 | 8/2006 | Tsutaichi |
| 2008/0119245 | A1 | 5/2008 | Jeong |
| 2008/0316687 | A1* | 12/2008 | Richardson .......... H04B 1/3888 361/679.09 |
| 2009/0272566 | A1* | 11/2009 | Nomiya et al. .............. 174/257 |
| 2010/0008028 | A1* | 1/2010 | Richardson et al. ..... 361/679.01 |
| 2010/0326995 | A1* | 12/2010 | Tang ...................... A45C 11/00 220/676 |

FOREIGN PATENT DOCUMENTS

| EP | 1675360 A2 | 6/2006 |
| EP | 1924062 A1 | 5/2008 |
| JP | 5-22389 A | 1/1993 |

(Continued)

OTHER PUBLICATIONS

Communication dated Jul. 3, 2014, from the European Patent Office in counterpart European Application No. 11858724.5.

*Primary Examiner* — Jenny L Wagner
*Assistant Examiner* — Michael P McFadden
(74) *Attorney, Agent, or Firm* — Sughrue Mion, PLLC

(57) ABSTRACT

Provided is a portable electronic device with excellent shock resistance without reducing design property. A portable electronic device according to an exemplary embodiment of the present invention is equipped with a case including a device (e.g., a speaker), a covering member that covers the device, a protrusion that is formed on the case, and a protective member that protects the covering member. The protective member is formed to protrude from the covering member and also with a substantially equivalent height to that of the protrusion. It is preferable that the protrusion is formed at facing edges of the case, and the protective member is formed between the protrusion.

8 Claims, 5 Drawing Sheets

(56) References Cited

FOREIGN PATENT DOCUMENTS

| | | |
|---|---|---|
| JP | 5-37617 A | 2/1993 |
| JP | 11-308311 A | 11/1999 |
| JP | 2000-174874 A | 6/2000 |
| JP | 2010-251947 A | 11/2010 |

* cited by examiner

PORTABLE ELECTRONIC DEVICE AND METHOD OF PROTECTING PORTABLE ELECTRONIC DEVICE

CROSS REFERENCE TO RELATED APPLICATIONS

This application is a National Stage of International Application No. PCT/JP2011/006241filed Nov. 8, 2011, claiming priority based on Japanese Patent Application No. 2011-029802 filed Feb. 15, 2011, the contents of all of which are incorporated herein by reference in their entirety.

TECHNICAL FIELD

The present invention relates to a portable electronic device and a method of protecting the portable electronic device.

BACKGROUND ART

As portable electronic devices, there are mobile phones, tablet terminals, digital cameras, notebook PCs, PDAs (Personal Digital Assistants), portable DVD (Digital Versatile Disk) players, portable music players, and portable televisions, for example.

The mobile phone, one kind of portable electronic devices, has a configuration as shown in FIG. 5, for example. That is, a mobile phone 100 shown in FIG. 5 includes a speaker (not shown) in the front of a case 200, various sensors (e.g., an acceleration sensor and a gyroscopic sensor) 300 near the speaker, and a light source 400 such as an LED (Light Emitting Diode), and the like.

These devices such as the speaker, the sensor 300, and the light source 400 are covered with a covering member 500 from above the case 200. The case and the covering member 500 have an opening 510 for propagating sound from the speaker to the outside. The covering member 500 is made of a relatively flexible member from viewpoints such as to ensure the performance of the speaker and the sensor 300 and to ensure transmittance of light emitted from the light source 400. Therefore, measures are taken not to damage the covering member 500 in case the mobile phone 100 is dropped, such that a periphery of the case 200 is covered with a soft case 600.

Incidentally, patent literatures 1 to 3 disclose techniques of forming a protrusion on a case of a portable electronic device. In patent literature 1, the protrusion is formed on the case to propagate sound to the outside when the portable electronic device is placed on a desk, for example, with an opening side of the case facing downward. In patent literature 2, the protrusion is formed on the case so as to reduce contact of an ear with the case when a user brings the user's ear close to an opening of the case in order to receive a call. In patent literature 3, the protrusion made of a soft elastomer is formed on edges of the case so as not to damage the portable electric device in the event of a fall.

CITATION LIST

Patent Literature

Patent literature 1: Japanese Unexamined Patent Application Publication No. 2010-251947
Patent literature 2: Japanese Unexamined Patent Application Publication No. H05-22389
Patent literature 3: Japanese Unexamined Patent Application Publication No. H05-37617

SUMMARY OF INVENTION

Technical Problem

As shown in FIG. 5, covering the periphery of the case 200 with the separate soft case reduces design property of the portable electronic device. The configuration with a part of the case protruding as with the protrusions in patent literatures 1 to 3 also reduces the design property of the portable electronic device.

An objective of the present invention is to provide a portable electronic device and a method of protecting the portable electronic device that can solve the abovementioned issue.

Solution to Problem

An exemplary aspect of the present invention is a portable electronic device including a case including a device, a covering member that covers the device, a protrusion that is formed on the case, and a protective member that protects the covering member. The protective member is formed to protrude from the covering member and also with a substantially equivalent height to a height of the protrusion.

Another exemplary aspect of the present invention is a method of protecting a portable electronic device. The method includes forming a portable electronic device, in which the portable electronic device comprising a case including a device, a covering member that covers the device, a protrusion that is formed on the case, and a protective member that protects the covering member. The protective member is formed to protrude from the covering member and also with a substantially equivalent height to a height of the protrusion.

Advantageous Effects of Invention

According to the present invention, it is possible to provide the portable electronic device with excellent shock resistance and the method of protecting the portable electronic device.

DESCRIPTION OF EMBODIMENTS

Below is an explanation for a portable electronic device and a method of protecting the portable electronic device according to an exemplary embodiment of the present invention. However, the present invention is not necessarily limited to the following exemplary embodiment. Moreover, the following description and drawings are simplified as appropriate for the sake of clarity of explanation. Note that an up-down direction, a left-right direction, and a front-back direction in the following description and drawings are defined for the sake of clarity of explanation, and they are changed depending on the usage patterns.

Figure 1:
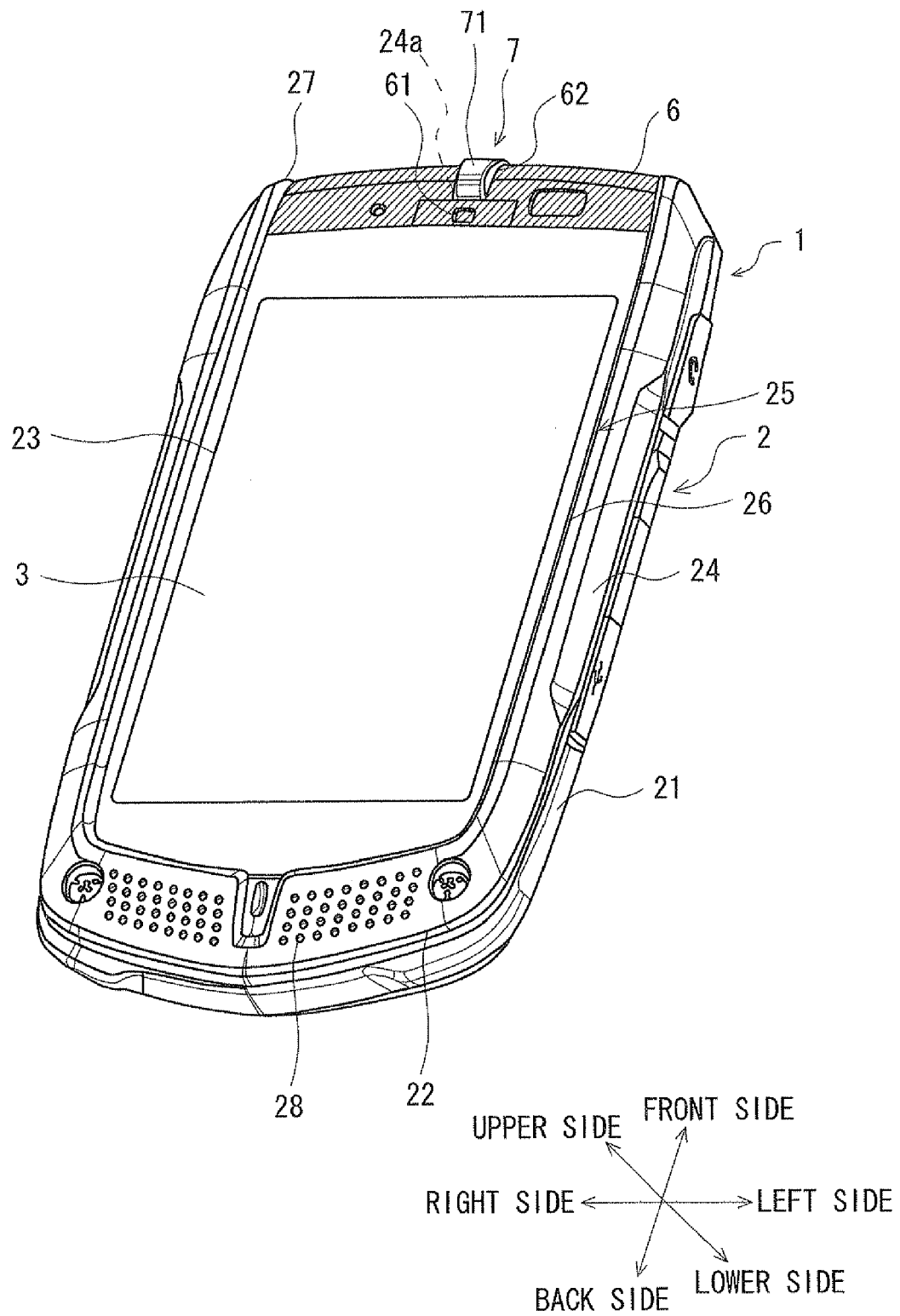
FIG. 1 is a perspective diagram schematically showing a portable electronic device according to an exemplary embodiment of the present invention.
Figure 2:
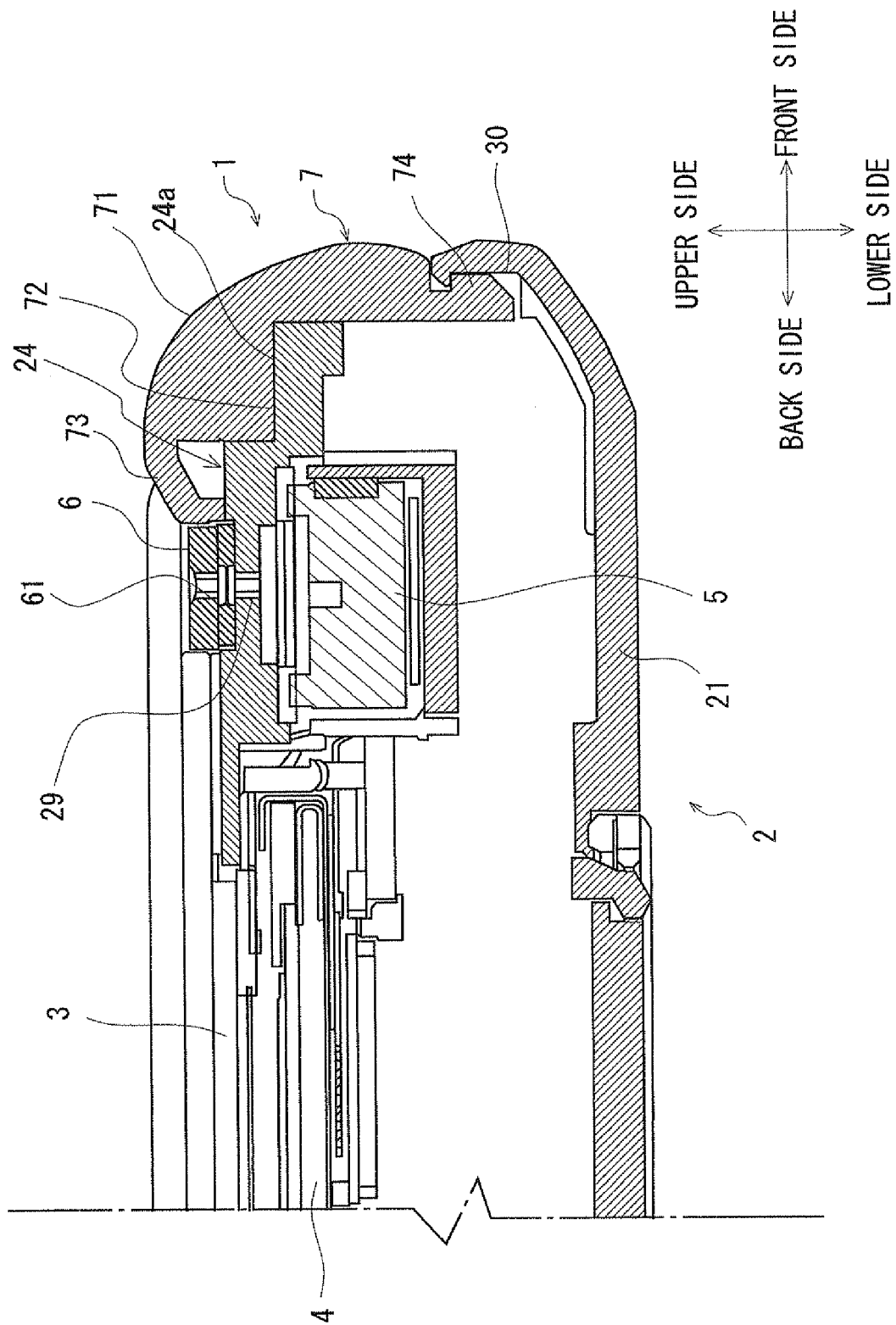
FIG. 2 is a partial cross-sectional view schematically showing the portable electronic device according to the exemplary embodiment of the present invention.

The portable electronic device according to this exemplary embodiment is a mobile phone 1 as shown in FIG. 1. As shown in FIG. 2, the mobile phone 1 is equipped with, for example, a case 2, a display unit 3 that includes a touch panel, a liquid crystal display and the like, and a control unit 4 that controls the display unit 3 in response to an operation on the touch panel and realizes the communication.

The case 2 includes a first case 21 and a second case 22 as shown in FIG. 1. The first case 21 functions as a lower lid of the case. As shown in FIG. 2, the display unit 3, the control unit 4 and the like are mounted on the first case 21. A microphone not shown is mounted on the back of the first case 21. Meanwhile, a speaker 5 is mounted on the front of the first case 21.

The speaker 5 of this exemplary embodiment is disposed on a substantial middle position in the left-right direction on the front of the first case 21. Although not shown in the drawings, various sensors and a light source are mounted as other devices near the speaker 5 on the front of the first case 21.

The second case 22 functions as an upper lid of the case. That is, the second case 22 and the first case 21 are stacked in the up-down direction and fixed by a fixing member such as a bolt. An opening 23 for exposing the display unit 3 is formed on a substantially middle part in a plan view of the second case 22. That is, a frame part 24 is formed around the display unit 3 in the second case 22. Consequently, as shown in FIG. 2, the speaker 5, the sensor, the light source and the like are disposed in a lower region of the front of the frame part 24. Therefore, the front of the frame part 24 is configured in such a manner that the speaker 5 and the sensor favorably functions, and light emitted from the light source is favorably transmitted. Moreover, a depression 24a is formed in the front of the frame part 24 so as to accommodate a part of a protective member 7, which is described later, and fix the protective member 7. Although specific illustration of the depression 24a is not presented here, the depression 24a is formed in a U-shape when viewed from the front and also in the plan view. Further, the depression 24a is formed in an L-shape when viewed from the side.

As shown in FIG. 1, a plurality of openings 28 are formed in the back of the frame part 24 to propagate sound to the microphone. Meanwhile, as shown in FIG. 2, an opening 29 is formed in the front of the frame part 24 to propagate sound from the speaker 5 to the outside.

Figure 3:
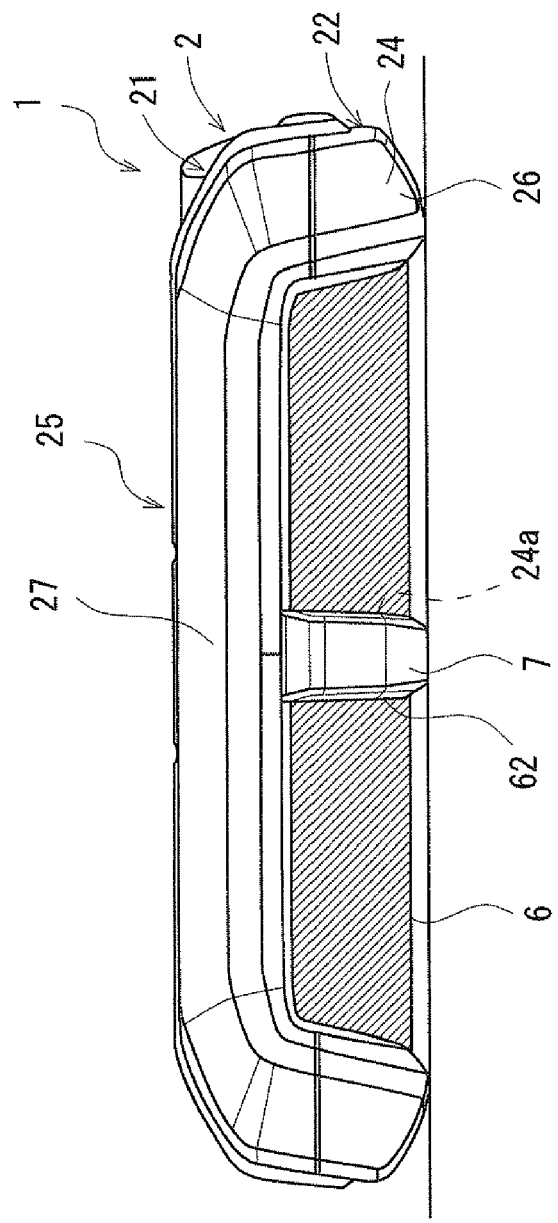
FIG. 3 is a diagram showing a state when the portable electronic device is placed on a desk, for example, with a display unit of the portable electronic device according to the exemplary embodiment of the present invention facing downward.

A covering member 6 continuously covers from the front to a front side surface of the frame part 24 (shaded parts of FIGS. 1 and 3). That is, in the plan view, the region where the devices such as the speaker 5, the sensor, and the light source are disposed is covered with the covering member 6.

The covering member 6 is made of a relatively flexible member (e.g., an acrylic member) in order for the speaker 5 and the sensor to favorably function and for the light emitted from the light source to be favorably transmitted. An opening 61 is formed in the covering member 6 so that the sound output from the speaker 5 propagates to the outside. This opening 61 communicates with the opening 29 of the second case 22. Moreover, a cutout 62 is formed in the covering member 6 so as to dispose therein the protective member 7 described later.

A protrusion 25 is formed in the abovementioned first case 21 and second case 22. In detail, as shown in FIG. 3, the protrusion 25 has a first part 26 and a second part 27. As shown in FIG. 1, the first part 26 is formed continuous with both left and right edges with the opening 23 interposed and a back side edge in the frame part 24. Moreover, as shown in FIG. 3, the second part 27 is formed continuous with both left and right edges of the front side surface of the first case 21 and the second case 22 and a lower side edge of the first case 21. The first part 26 and second part 27 are formed continuously. That is, the first part 26 and second part 27 are annularly formed.

The first part 26 projects upward from the display unit 3. Moreover, the second part 27 projects forward from the covering component 6. In detail, the height of the first part 26 is configured not to bring the display unit 3 into contact with a placing surface when the mobile phone 1 is placed on a desk, for example, with the display unit 3 side of the mobile phone 1 facing downward. Moreover, the height of the second part 27 is configured not to bring the covering member 6 in contact with a dropped surface when the mobile phone 1 is dropped on the front side.

However, the arrangements and shapes of the first part 26 and the second part 27 should be those that do not bring the display unit 3 and the covering member 6, into contact with the placing surface or the dropped surface when the mobile phone 1 is placed on a desk, for example, with the display unit 3 side of the mobile phone 1 facing downward, or when the mobile phone 1 is dropped on the front side.

As shown in FIGS. 1 and 2, the protective member 7 is disposed in front of the opening 61 in the covering member 6 and also on a substantial middle position in the left-right direction on a front side edge of the case 2. The protective member 7 is accommodated inside the cutout 62 of the covering member 6 and inside the depression 24a of the frame part 24, and fixed by the depression 24a, the covering member 6, and the first case 21.

As shown in FIG. 3, the protective member 7 has a shape in which the protective member, together with the first part 26 or the second part 27 of the protrusion 25, comes into contact with the placing surface or the dropped surface when the mobile phone 1 is placed on a desk, for example, with the display unit 3 side facing downward or when the mobile phone 1 is dropped on the front side, and thereby not bringing the display unit 3 or the covering member 6 into contact with the placing surface or the dropped surface. That is, the protective member 7 is formed to protrude from the covering member 6 and also with a substantially equivalent height as that of the first part 26 and the second part 27.

The width dimension of the protective member 7 is configured not to fluctuate the mobile phone 1 when the protective member 7, together with the first part 26 or the second part 27, comes into contact with the placing surface or the dropped surface. Moreover, the protective member 7 is made of a material that is not deformed and does not bring the covering member 6 into contact with the placing surface or the dropped surface in the event of a contact with the placing surface and the dropped surface together with the first part 26 and the second part 27. For example, the protective member 7 is made of plastic resin, elastomer material, etc.

Then, when the mobile phone 1 is placed on a desk, for example, with the display unit 3 side of the mobile phone 1 facing downward or when the mobile phone 1 is dropped on the front side, the protective member 7 and the protrusion 25 come into contact with the placing surface or the dropped surface, thereby not bringing the covering member 6 into direct contact with the placing surface or the dropped surface. This therefore prevents damage to the covering member 6 and eventually improves shock resistance of the mobile phone 1.

Furthermore, the substantially equal height of the protective member 7 to the height of the first part 26 and the second part 27 does not protrude only the protective member 7 to be prominent, and thus maintaining the design property of the entire mobile phone 1.

Figure 4:
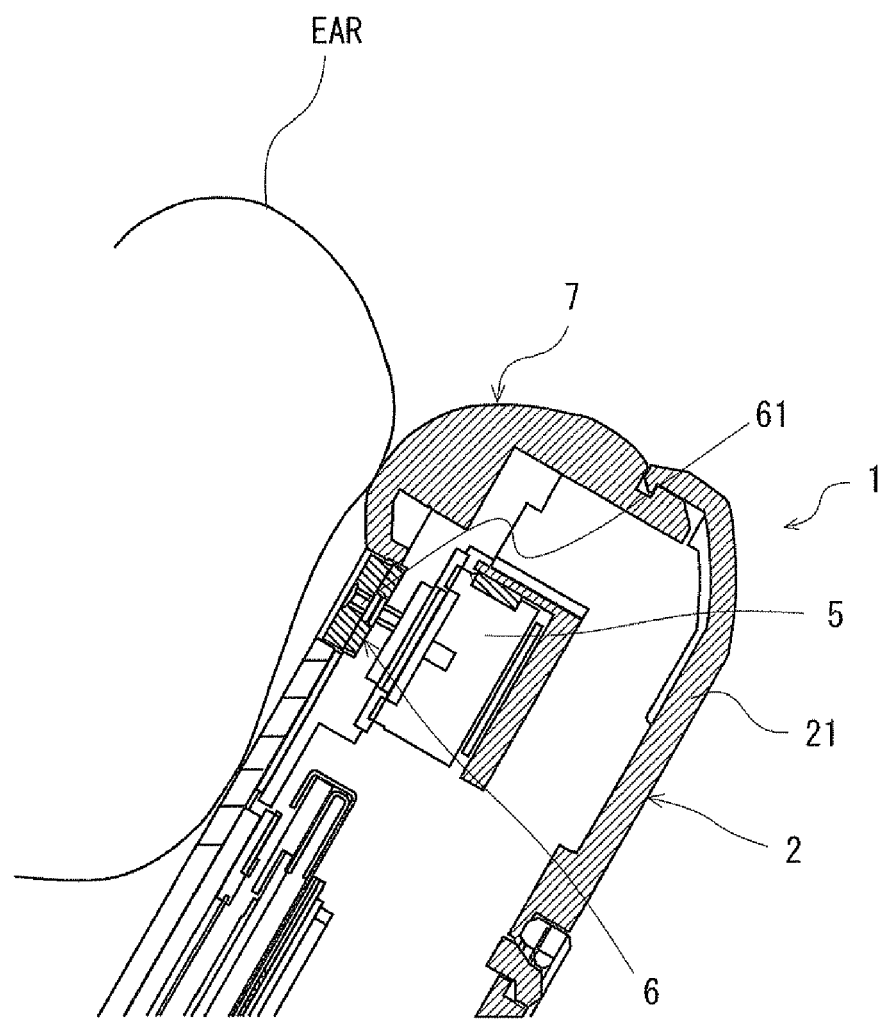
FIG. 4 is a diagram showing a state when the portable electronic device according to the exemplary embodiment of the present invention is brought close to a user's ear.
Figure 5:
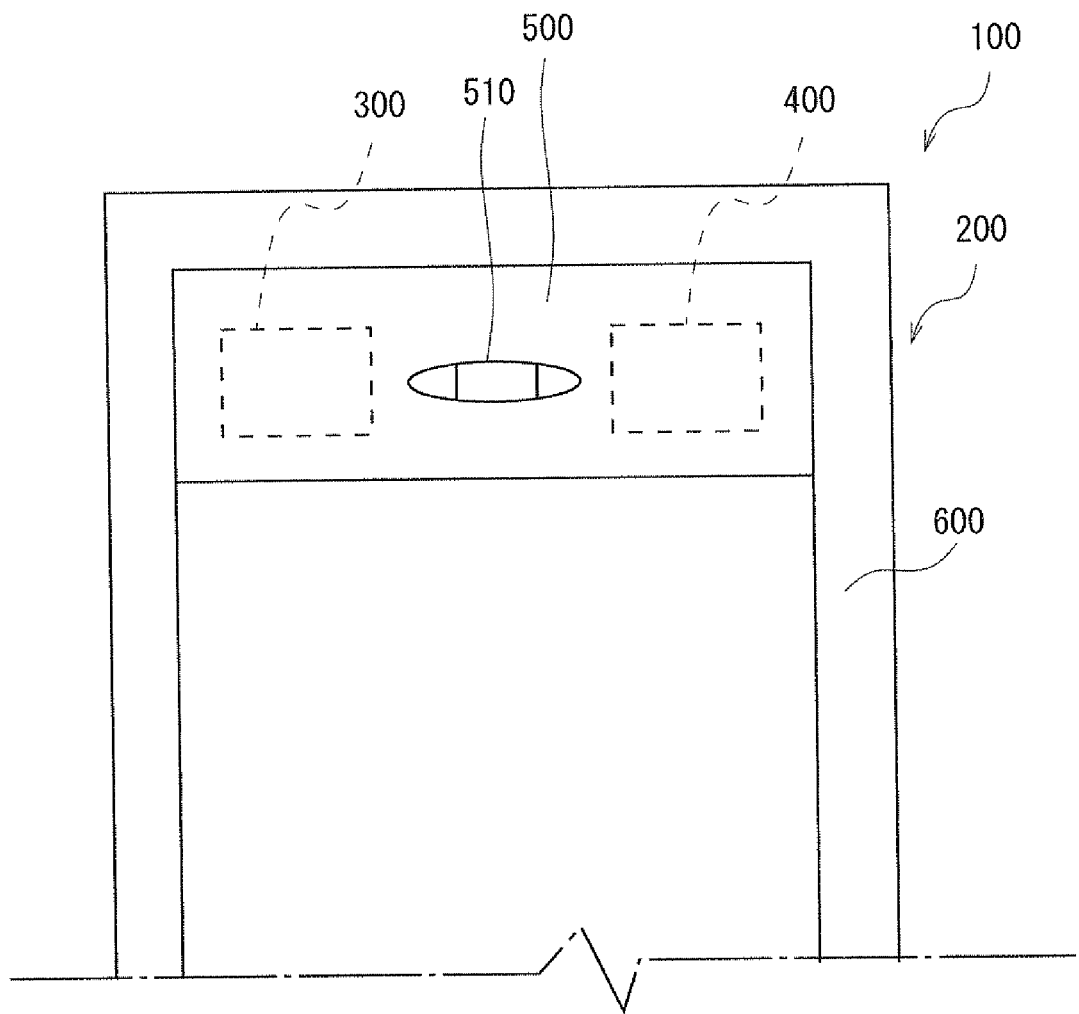
FIG. 5 is a partial plan view schematically showing a related portable electronic device.

As shown in FIG. 4, Additionally, when a user brings a user's ear close to the opening 61 of the second case 22 in order to receive a call, the protective member 7 comes into contact with the ear and prevents dust from entering the space between the ear and the speaker 5 without blocking the opening 61 with the ear. This enables the sound from the speaker 5 to favorably propagate to the outside and reach the ear. Moreover, in order to prevent dust from entering the space, it is almost unnecessary to form a depression near the opening 61, for example, and thus enables improvement in the design property of the mobile phone 1.

A specific shape of the protective member 7 is explained here. As shown in FIGS. 1 and 2, a round surface 71 that is substantially horizontal to the left-right direction and curves in the front-back direction is formed in an outer periphery of the protective member 7. This round surface 71 is formed to be substantially continuous with the front side surface of the first case 21. Moreover, a stepped part 72 is formed in an inner periphery of the protective member 7 so as to favorably place the protective member 7 on an upper surface inside the depression 24a of the frame part 24. Further, a plate part 73 that curves backward is formed in an upper edge of the protective member 7. A tip of the plate part 73 is pressed against a front side surface of the covering member 6 when the protective member 7 is fixed. At this time, the plate part 73 functions as a leaf spring. Moreover, a fitting nail 74 is formed at a lower edge of the protective member 7 to be fitted to a fitting groove 30 formed on the side of the first case 21.

Upon fixing such protective member 7 to the case 2, firstly, while the tip of the plate part 73 is pressed against the front side surface of the covering member 6, the protective member 7 is moved downward, a part of the protective member 7 is accommodated inside the depression 24a of the frame part 24, and at the same time as placing the stepped part 72 of the protective member 7 on the upper surface inside the depression 24a of the frame part 24, the fitting nail 74 of the protective member 7 is fitted to the fitting groove 30 of the first case 21. Then, the upper edge of the protective member 7 is restrained by the covering member 6, and the lower edge of the protective member 7 is restrained by the first case 21. Further, left and right side surfaces of the protective member 7 are restrained by left and right side surfaces inside the depression 24a of the frame 24. This facilitates fixing of the protective member 7 to the case 2. In addition, as shown in FIG. 4, when the user brings the user's ear close to the opening 61 of the second case 22 in order to receive a call and the protective member 7 comes into contact with the ear, the round surface in the outer periphery of the protective member 7 can reduce discomfort of the user.

The present invention is not limited to the above exemplary embodiment but can be modified as appropriate without departing from the scope.

Although the above exemplary embodiment illustrated an example of the mobile phone as the portable electronic device, it is not limited to this. Specifically, the above exemplary embodiment can be carried out in a substantially similar manner when using a mobile phone, a tablet terminal, a digital camera, a notebook computer, a PDA (Personal Digital Assistant), a portable DVD (Digital Versatile Disk) player, a portable television and the like.

In the above exemplary embodiment, the protective member 7 is disposed at the edges of the case 2, however the disposing position is not limited to this as long as the covering member 6 is favorably protected.

Although in the above exemplary embodiment, the protection member 7 and the case 2 are configured as separate members, they may be integrally configured.

The above exemplary embodiment includes the speaker 5, the sensor, and the light source as devices, however it is not limited to this. The devices may be those that are generally disposed in the lower region of the covering member 6.

The present application claims priority rights of and is based on Japanese Patent Application No. 2011-29802 filed on Feb. 15, 2011 in the Japanese Patent Office, the entire contents of which are hereby incorporated by reference.

INDUSTRIAL APPLICABILITY

The present invention can be used to portable electronic devices such as mobile phones, tablet terminals, digital cameras, notebook PCs, PDAs (Personal Digital Assistants), portable DVD (Digital Versatile Disk) players, portable music players, and portable televisions.

| | Reference Signs List | | |
|---|---|---|---|
| 1 | MOBILE PHONE | | |
| 2 | CASE, | 21 FIRST CASE, | 22 SECOND CASE |
| 23 | OPENING | | |
| 24 | FRAME PART | | |
| 24a | DEPRESSION | | |
| 25 | PROTRUSION, | 26 FIRST PART, | 27 SECOND PART |
| 28, 29 | OPENING | | |
| 30 | FITTING GROOVE | | |
| 3 | DISPLAY UNIT | | |
| 4 | CONTROL UNIT | | |
| 5 | SPEAKER | | |
| 6 | COVERING MEMBER, | 61 OPENING, | 62 CUTOUT |
| 7 | PROTECTING MEMBER, | 71 ROUND SURFACE, | 72 STEPPED PART |
| 73 | PLATE PART, | 74 FITTING NAIL | |
| 100 | CELLULAR PHONE | | |
| 200 | CASE | | |
| 300 | SENSOR | | |
| 400 | LIGHT SOURCE | | |

| Reference Signs List | |
|---|---|
| 500 | COVERING MEMBER |
| 510 | OPENING |
| 600 | SOFT CASE |

The invention claimed is:

1. A portable electronic device comprising:
a case comprising first and second cases, the first and second cases enclosing a speaker, a sensor, and a light source mounted inside the case;
a covering member that covers the speaker, the sensor, and the light source mounted in a front part inside the case, the covering member being adapted to let light from the light source pass through and formed by a flexible member such as an acrylic member;
a protrusion formed on the case, the protrusion protruding upward and forward from the case in a state where the first and second cases are closed; and
a protective member that protects the covering member, wherein the protective member protrudes upward and forward from the case beyond the covering member and an upward height of the protective member is roughly equal to an upward height of the protrusion.

2. The portable electronic device according to claim 1, wherein
the protrusion is formed on facing edges of the case, and the protective member is disposed between the protrusion.

3. The portable electronic device according to claim 1, wherein
the covering member is disposed near an edge of the case, and
the protective member is disposed on the edge of the case where the covering member is disposed.

4. The portable electronic device according to claim 1, wherein the protective member includes a round surface.

5. The portable electronic device according to claim 4, wherein
the protective member is fixed to the case, and
the round surface of the protective member is formed continuous with a side surface of the case.

6. A method of protecting a portable electronic device comprising:
forming a portable electronic device, the portable electronic device comprising a case comprising first and second cases, the first and second cases enclosing a speaker, a sensor, and a light source mounted inside the case, a covering member that covers the speaker, the sensor, and the light source mounted in a front part inside the case, the covering member being adapted to let light from the light source pass through and formed by a flexible member such as an acrylic member, a protrusion that is formed on the case and protrudes upward and forward from the case in a state where first and second cases are closed, and a protective member that protects the covering member,
wherein the protective member is disposed to protrude upward and forward from the case beyond the covering member and so that an upward height of the protective member is roughly equal to an upward height of the protrusion.

7. The portable electronic device according to claim 1, wherein the protective member is a member distinct from the protrusion member, and is affixed to a cutout of the covering member and a depression of the case.

8. The method of protecting a portable electronic device according to claim 6, wherein the protective member is affixed to a cutout of the covering member and a depression of the case, the protective member being distinct from the protrusion member.

* * * * *